United States Patent
Johnson et al.

(10) Patent No.: US 8,169,841 B2
(45) Date of Patent: May 1, 2012

(54) STROBE APPARATUS, SYSTEMS, AND METHODS

(75) Inventors: James Brian Johnson, Boise, ID (US);
Paul A. LaBerge, Shoreview, MN (US);
Jake Klier, Blaine, MN (US)

(73) Assignee: Micron Technology, Inc., Boise, ID (US)

( * ) Notice: Subject to any disclaimer, the term of this patent is extended or adjusted under 35 U.S.C. 154(b) by 554 days.

(21) Appl. No.: 12/358,977

(22) Filed: Jan. 23, 2009

(65) Prior Publication Data

US 2010/0188906 A1    Jul. 29, 2010

(51) Int. Cl.
*G11C 7/00* (2006.01)

(52) U.S. Cl. .................... 365/193; 365/194; 365/233.1; 365/233.13

(58) Field of Classification Search .............. 365/194, 365/233.1, 233.13, 193
See application file for complete search history.

(56) References Cited

U.S. PATENT DOCUMENTS

| | | |
|---|---|---|
| 6,819,599 B2 | 11/2004 | Schaefer |
| 7,349,269 B2 | 3/2008 | Schaefer |
| 2007/0036023 A1* | 2/2007 | Hsieh et al. .................... 365/233 |
| 2008/0031079 A1* | 2/2008 | Osawa et al. .............. 365/233.1 |
| 2010/0182855 A1* | 7/2010 | Koshizuka .................... 365/193 |

* cited by examiner

*Primary Examiner* — Vu Le
*Assistant Examiner* — Han Yang
(74) *Attorney, Agent, or Firm* — Schwegman, Lundberg & Woessner, P.A.

(57) ABSTRACT

A strobe signal is received in a device and execution of an operation in the device is delayed when the strobe signal includes a preamble. Additional apparatus, systems, and methods are disclosed.

26 Claims, 8 Drawing Sheets

STROBE APPARATUS, SYSTEMS, AND METHODS

BACKGROUND

Information used by a processor is often stored in a memory system. The information may be sent to the memory system using a plurality of channels. If information is not transmitted continuously on the channels, there can be periods of dead time when no signals are on the channels, and the dead time can lead to inter-symbol interference (ISI) on the channels.

DETAILED DESCRIPTION

Systems including one or more memory devices can operate by sending a strobe signal to indicate the availability of data during a read or a write operation. The strobe signal may include a preamble. In this description, a preamble can be a segment of a signal that is transmitted before the main portion of the signal. A device receiving the signal responds in one way to the preamble and in a second way to the main portion of the signal.

The strobe signal can include a preamble for one or more reasons. For example, there may be dead time on a channel that carries the strobe signal during which charge builds up because the channel is not carrying a signal. The initial portion of the signal sent after the dead time may be affected by ISI on the channel. Thus, one reason to send a preamble might be to substantially clear the channel of the ISI effects. However, the preamble may tend to absorb power and bandwidth without contributing to an exchange of information.

Memory devices in modern systems are often designed to operate with less power and provide more data faster within a limited amount of bandwidth. Some memory devices run without a free-running clock to save power. Memory devices that do not generate or receive a free-running clock are not able to determine the amount of dead time experienced by a channel from which a signal is received, and are therefore not able to predict the effect of ISI on the channel.

The inventors have discovered that the challenges noted above, as well as others, can be addressed by selectively sending a preamble with a strobe signal during a read or a write operation involving one or more memory devices. The existence of the preamble with the strobe signal can be indicated by sending a first command, and the absence of the preamble can be indicated by sending a second command instead of the first command. A memory device without a free-running clock is substantially unable to measure periods of dead time on a channel, and is unable to determine if a preamble is desirable to reduce ISI effects in the channel. Sending a first command to indicate the existence of the preamble and a second command to indicate its absence enables a memory device without a free-running clock to respond appropriately.

Figure 1:
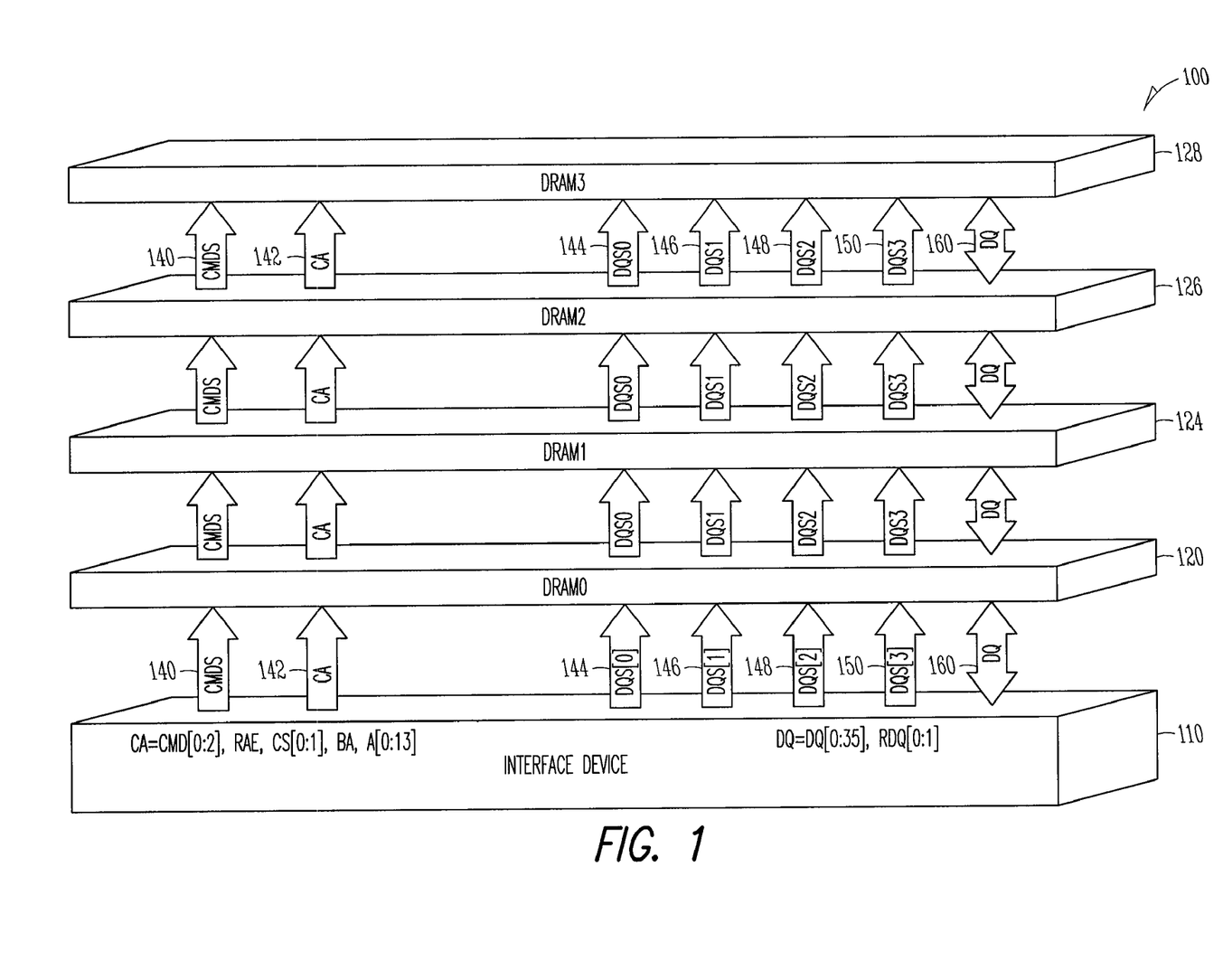
FIG. 1 is a multi-dimensional representation of a system according to various embodiments of the invention.

FIG. 1 is a multi-dimensional representation of a system 100 according to various embodiments of the invention. The system 100 includes a interface device 110 and several separate integrated circuit (IC) dice 120, 124, 126 and 128. The interface device 110 and the IC dice 120, 124, 126 and 128 may be separate devices formed of semiconductor material with electronic circuitry. Each of the IC dice 120, 124, 126 and 128 is a memory device, such as a dynamic random access memory (DRAM) device or a flash memory device. The IC dice 120, 124, 126 and 128 may include flash memory devices or DRAM devices or a combination of flash memory devices and DRAM devices according to various embodiments of the invention. The system 100 may include more or fewer IC dice according to various embodiments of the invention.

Information is exchanged between the interface device 110 and the IC dice 120, 124, 126 and 128 through a plurality of channels, some of the channels being grouped together in buses. Each of the channels may comprise an electrically conductive path to carry a signal between the interface device 110 and the IC dice 120, 124, 126 and 128. The information includes one or more of data, address and control information, or other information. A command strobe (CMDS) channel 140 carries a CMDS signal. A group of command and address (CA) channels 142 carry CA signals including the following signals: three command (CMD) signals on channels CMD [0:2]; an enable (RAE) signal on one channel; a bank address (BA) signal on one channel; two chip select (CS) signals on channels CS [0:1]; and address (A) signals on channels A[0:13].

Four data strobe (DQS) channels 144, 146, 148 and 150 carry DQS signals. A data (DQ) bus 160 is a bidirectional bus that carries DQ signals on channels DQ[0:35] and RDQ [0:1].

The channels 140, 142, 144, 146, 148 and 150 carry signals from the interface device 110 to the IC dice 120, 124, 126 and 128, and the bidirectional DQ bus 160 carries data signals between the interface device 110 and the IC dice 120, 124, 126 and 128. The system 100 may include more or less channels according to various embodiments of the invention. The interface device 110 and the IC dice 120, 124, 126 and 128 together may be referred to as a stack.

The IC dice 120, 124, 126 and 128 do not generate or receive a free-running clock, and are substantially unable to measure periods of dead time on the channels 144, 146, 148 and 150, and thus, are unable to determine if a preamble is desirable to reduce ISI effects in the channels 144, 146, 148 and 150 that carry the DQS signals. One or more of the DQS signals may include a preamble to reduce these ISI effects. The channels CMD [0:2] will carry a first command from the interface device 110 to indicate the existence of a preamble transmitted with at least one of the DQS signals. The channels CMD [0:2] will carry a second command from the interface device 110 to indicate the absence of a preamble with at least one of the DQS signals. A preamble detection circuit (not shown) in each of the IC dice 120, 124, 126 and 128 responds to the command from the channels CMD [0:2] to transfer DQ signals appropriately if a preamble is transmitted with a DQS signal.

Figure 2:
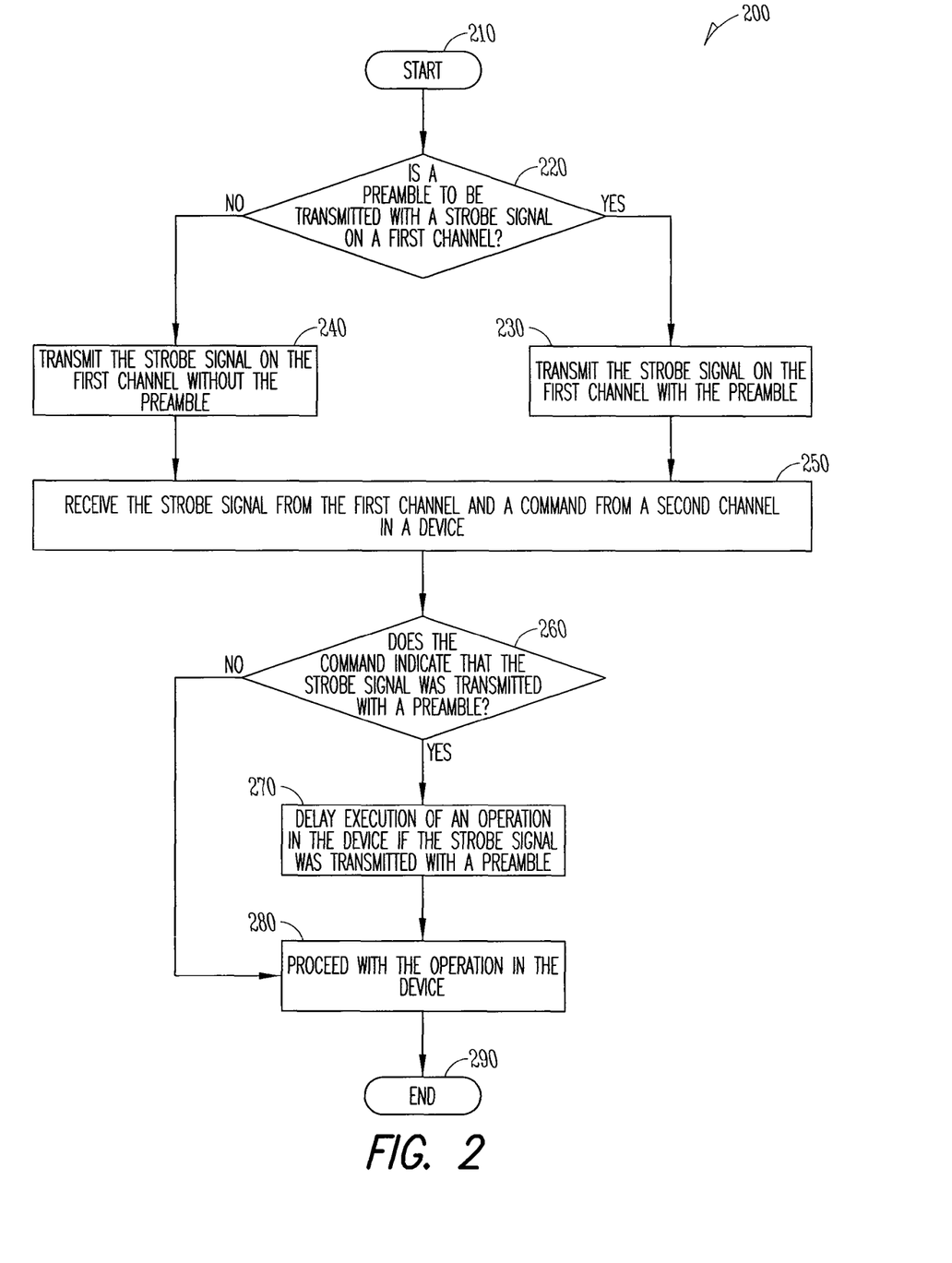
FIG. 2 is a flow diagram of a method according to various embodiments of the invention.

FIG. 2 is a flow diagram of a method 200 according to various embodiments of the invention. In block 210, the method 200 starts. In block 220, it is determined if a preamble is to be transmitted with a strobe signal on a first channel. If so, the strobe signal is transmitted on the first channel with a preamble in block 230. If not, the strobe signal is transmitted on the first channel without the preamble in block 240. In block 250, the strobe signal is received from the first channel and a command is received from a second channel in a device. In block 260, it is determined from the command if the strobe signal was transmitted with a preamble. If so, execution of an operation in the device is delayed in block 270 if the strobe signal was transmitted with a preamble. In either case, execution of the operation proceeds in block 280, and the method 200 ends in block 290.

The individual activities of the method 200 do not have to be performed in the order shown or in any particular order. Some activities may be repeated, and others may occur only once. Various embodiments may have more or fewer activities than those shown in FIG. 2.

Figure 3:
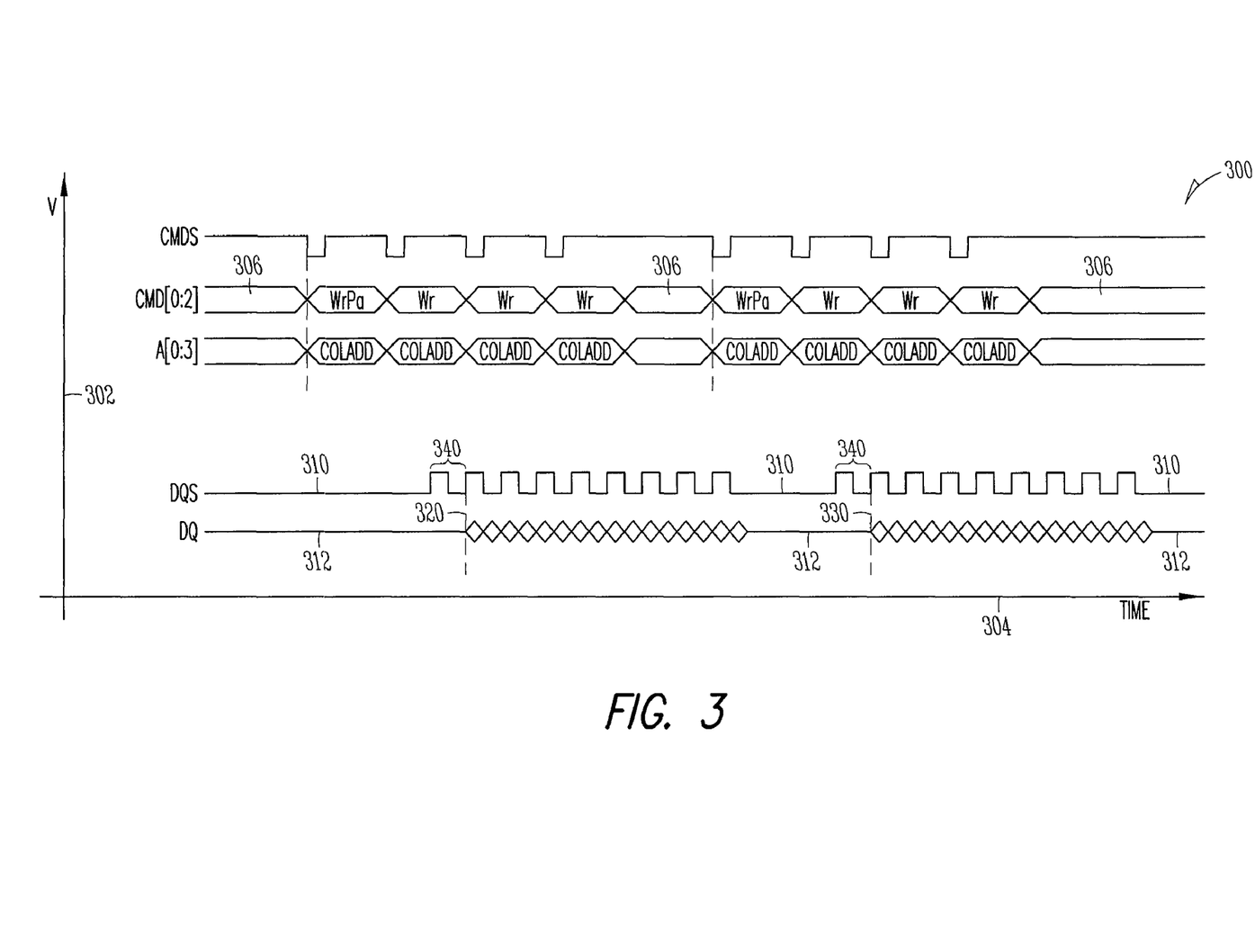
FIG. 3 is a timing chart according to various embodiments of the invention.

FIG. 3 is a timing chart 300 according to various embodiments of the invention. The timing chart 300 shows signals exchanged between the interface device 110 and the IC dice 120, 124, 126 and 128 shown in FIG. 1.

The timing chart 300 includes the CMDS signal, the three CMD signals from channels CMD [0:2], four of the A signals from channels A [0:3], one of the DQS signals from the channels 144, 146, 148 and 150, and one of the DQ signals from the DQ bus 160. The signals are shown with reference to voltage on a vertical axis 302, and with reference to time on a horizontal axis 304. The CMD signals are latched on the edges of the CMDS signal.

The timing chart 300 shows consecutive write commands (Wr) transmitted in two groups separated by dead time 306. The two groups together in the timing chart 300 represent non-consecutive write commands. The dead time 306 between Wr commands is followed by dead time 310 on the channel carrying the DQS signal and dead time 312 on the channel carrying the DQ signal. A write with preamble command (WrPa) is transmitted before the consecutive Wr commands to indicate that the DQS signal includes a preamble having a duration of one or more DQS signal edges. The WrPa command causes a preamble detection circuit (described below) to delay execution of a write operation for the duration of the preamble.

The DQ signal represents data that is latched and written to cells in a memory device, and the DQ signal transmitted with the first group of commands is latched beginning at the time 320 after two DQS signal edges of the preamble have passed following the receipt of the WrPa command in the first group of commands. The DQ signal from the second group of commands is latched beginning at the time 330 after two DQS signal edges of the preamble have passed following the receipt of the WrPa command in the second group of commands. The preamble of the DQS signal puts a known potential on the channel transmitting the DQS signal which had previously experienced the dead time 310. A full period 340 of the DQS signal, including two DQS signal edges, occurs before the DQ signal is latched to reduce the effects of ISI in the channel carrying the DQS signal.

A preamble may not be transmitted with the DQS signal in the timing chart 300 depending on the characteristics of the channel. For example, if the period of the DQS signal is long enough to allow the channels 144, 146, 148 and 150 to fully charge or discharge between DQS signal edges, then the preamble may not be transmitted with the DQS signal. If a timing difference between a first DQS signal edge and successive DQS signal edges due to ISI is negligible, and the information in the DQS signal edges may be captured, then the preamble may not be transmitted with the DQS signal. Finally, if the temporal length of the dead times 310 are short enough to reduce ISI in the channels 144, 146, 148 and 150, then the preamble may not be transmitted with the DQS signal.

Figure 4:
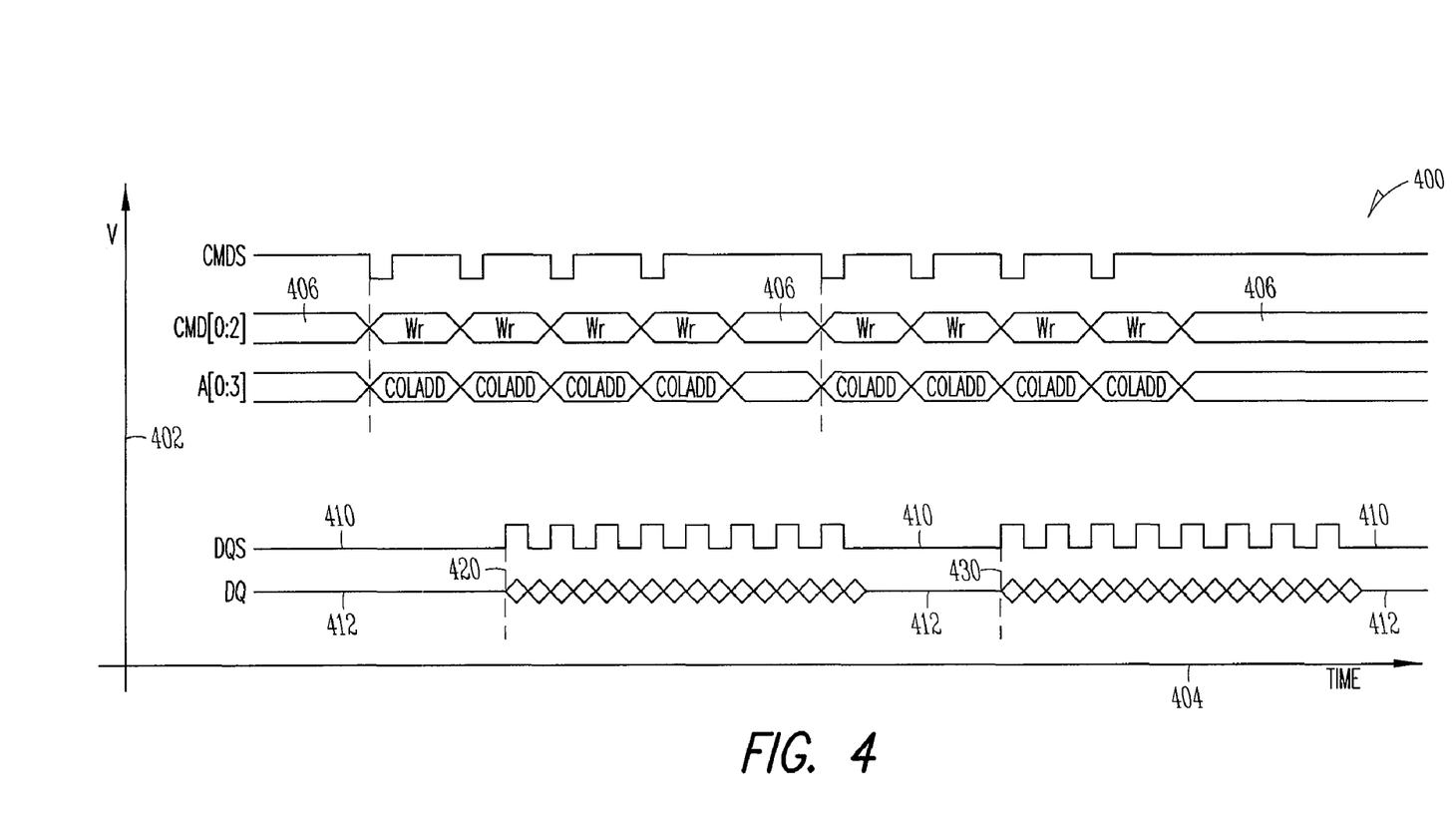
FIG. 4 is a timing chart according to various embodiments of the invention.

FIG. 4 is a timing chart 400 according to various embodiments of the invention. The timing chart 400 shows signals exchanged between the interface device 110 and the IC dice 120, 124, 126 and 128 shown in FIG. 1.

The timing chart 400 includes the CMDS signal, the three CMD signals from channels CMD [0:2], four of the A signals from channels A [0:3], one of the DQS signals from the channels 144, 146, 148 and 150, and one of the DQ signals from the DQ bus 160. The signals are shown with reference to voltage on a vertical axis 402, and with reference to time on a horizontal axis 404. The CMD signals are latched on the edges of the CMDS signal.

The timing chart 400 shows consecutive Wr commands transmitted in two groups separated by dead time 406. The two groups together in the timing chart 400 represent non-consecutive write commands. The dead time 406 between Wr commands is followed by dead time 410 on the channel carrying the DQS signal and dead time 412 on the channel carrying the DQ signal.

A preamble is not transmitted with the DQS signal in the timing chart 400 for any one of the reasons stated above with respect to the timing chart 300 shown in FIG. 3. Thus, the execution of the Wr commands is not delayed by a preamble.

The DQ signal represents data that is latched and written to cells in a memory device, and the DQ signal with the first group of commands is latched beginning at the time 420 at the first leading DQS signal edge following a dead time 410. The DQ signal with the second group of commands is latched beginning at the time 430 at the second leading DQS signal edge following a dead time 410.

Figure 5:
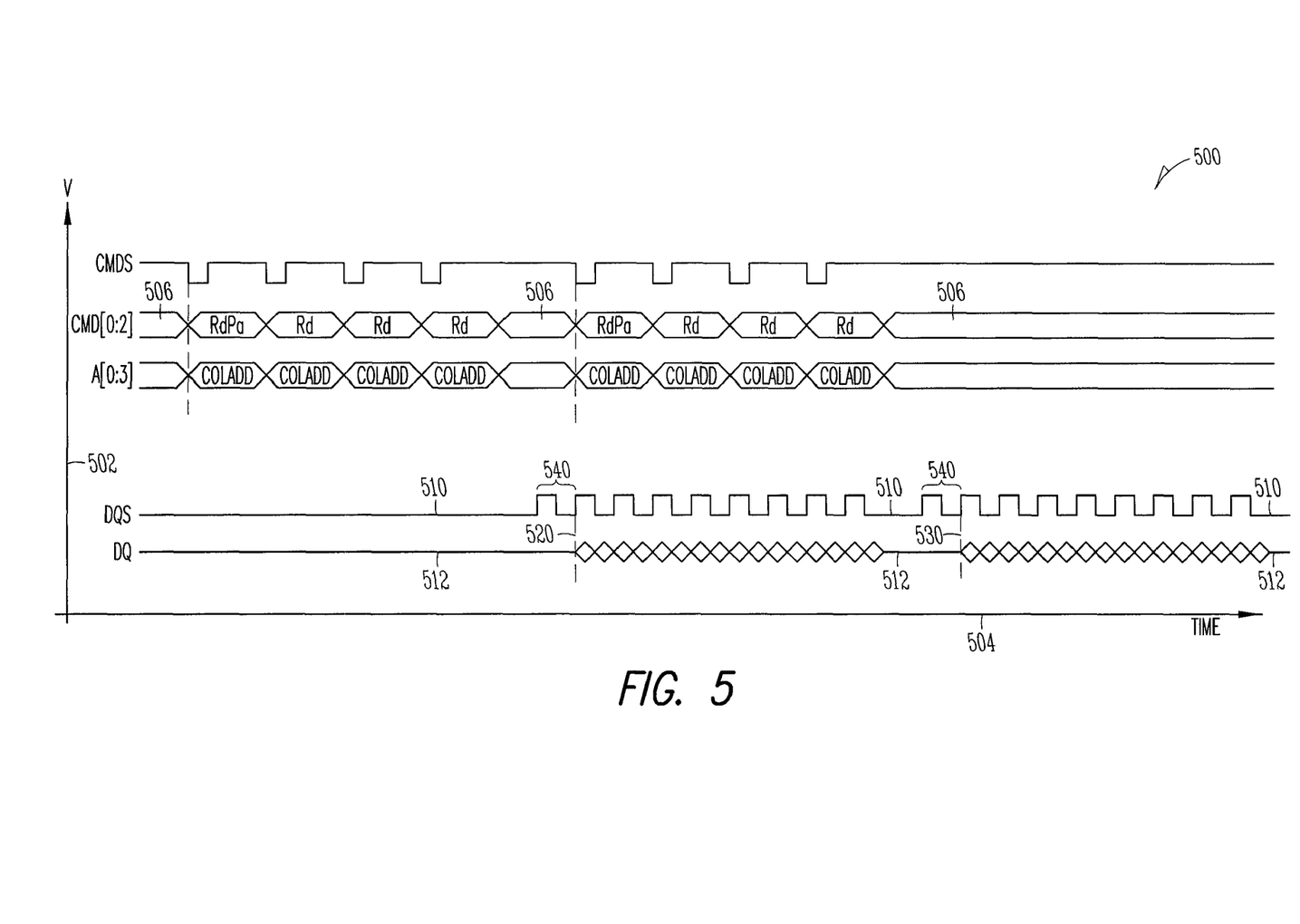
FIG. 5 is a timing chart according to various embodiments of the invention.

FIG. 5 is a timing chart 500 according to various embodiments of the invention. The timing chart 500 shows signals exchanged between the interface device 110 and the IC dice 120, 124, 126 and 128 shown in FIG. 1.

The timing chart 500 includes the CMDS signal, the three CMD signals from channels CMD [0:2], four of the A signals from channels A [0:3], one of the DQS signals from the channels 144, 146, 148 and 150, and one of the DQ signals from the DQ bus 160. The signals are shown with reference to voltage on a vertical axis 502, and with reference to time on a horizontal axis 504. The CMD signals are latched on the edges of the CMDS signal.

The timing chart 500 shows consecutive read commands (Rd) transmitted in two groups separated by dead time 506. The two groups together in the timing chart 500 represent non-consecutive read commands. The dead time 506 between Rd commands is followed by dead time 510 on the channel carrying the DQS signal and dead time 512 on the channel carrying the DQ signal. A read with preamble command (RdPa) is transmitted before the consecutive Rd commands to indicate that the DQS signal includes a preamble having a duration of one or more DQS signal edges. The RdPa command causes a preamble detection circuit to delay execution of a read operation for the duration of the preamble.

The DQ signal represents data that is retrieved from cells in a memory device and transmitted to another device, and the DQ signal with the first group of commands is latched beginning at a time 520 after two DQS signal edges of the preamble have passed. The DQ signal with the second group of commands is latched beginning at a time 530 after two DQS signal edges of the preamble have passed following the receipt of the RdPa command in the second group of commands. The preamble of the DQS signal puts a known potential on the channel transmitting the DQS signal which had previously experienced the dead time 510. A full period 540 of the DQS signal, including two DQS signal edges, occurs before the DQ signal is latched to reduce the effects of ISI in the channel carrying the DQS signal.

Figure 6:
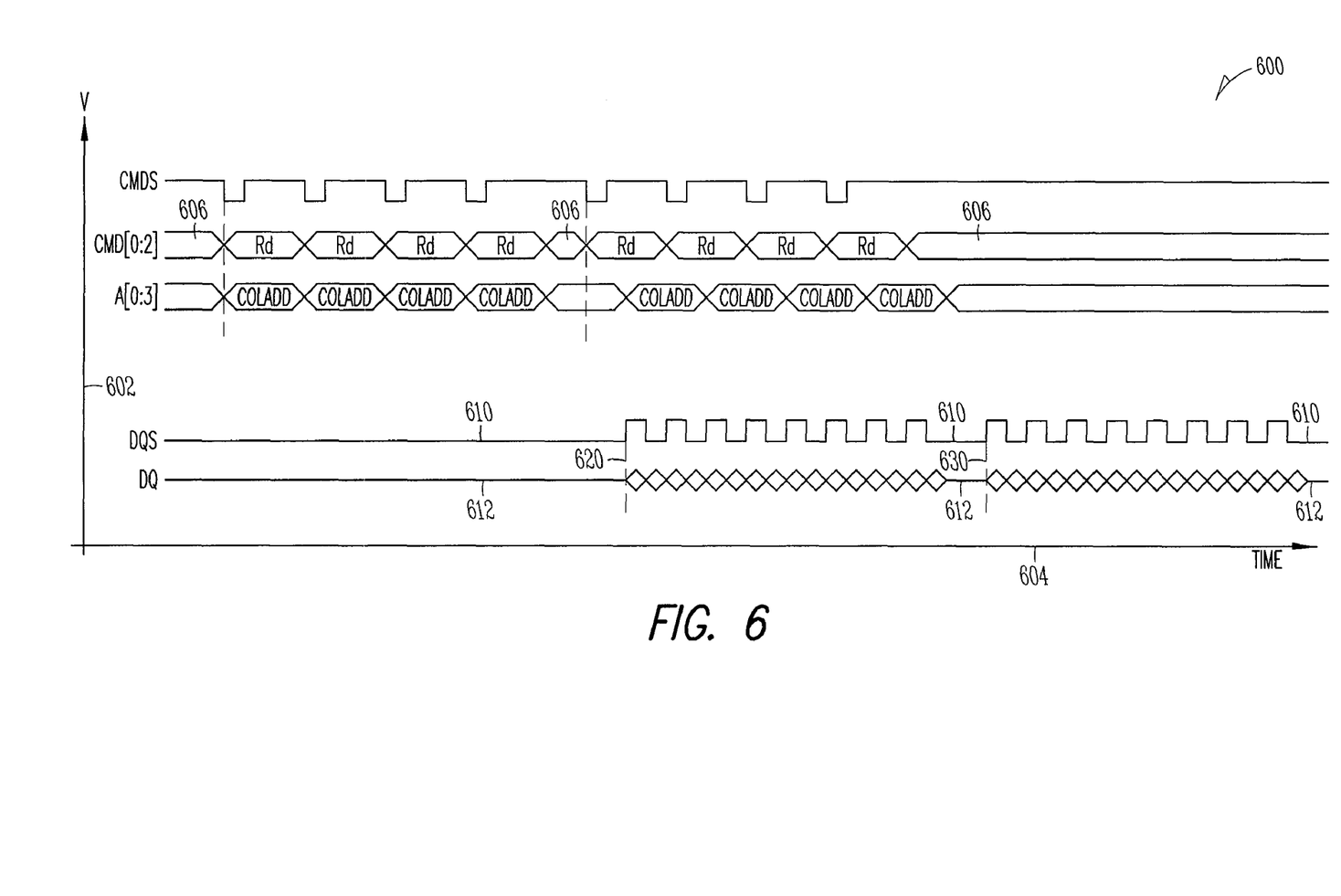
FIG. 6 is a timing chart according to various embodiments of the invention.

FIG. 6 is a timing chart 600 according to various embodiments of the invention. The timing chart 600 shows signals exchanged between the interface device 110 and the IC dice 120, 124, 126 and 128 shown in FIG. 1.

The timing chart 600 includes the CMDS signal, the three CMD signals from channels CMD [0:2], four of the A signals from channels A [0:3], one of the DQS signals from the channels 144, 146, 148 and 150, and one of the DQ signals from the DQ bus 160. The signals are shown with reference to voltage on a vertical axis 602, and with reference to time on a horizontal axis 604. The CMD signals are latched on edges of the CMDS signal.

The timing chart 600 shows consecutive Rd commands transmitted in two groups separated by dead time 606. The two groups together in the timing chart 600 represent non-consecutive read commands. The dead time 606 between Rd commands is followed by dead time 610 on the channel carrying the DQS signal and dead time 612 on the channel carrying the DQ signal.

A preamble is not transmitted with the DQS signal in the timing chart 600 for any one of the reasons stated above with respect to the timing chart 300 shown in FIG. 3. Thus, the execution of the Rd commands is not delayed by a preamble.

The DQ signal represents data that is latched and written to cells in a memory device, and the DQ signal with the first group of commands is latched beginning at the time 620 at the first leading DQS signal edge following a dead time 610. The DQ signal with the second group of commands is latched beginning at the time 630 at the second leading DQS signal edge following a dead time 610.

Preambles are shown in FIG. 3 and FIG. 5 including two DQS signal edges. Preambles including one or three or more DQS signal edges may be utilized according to various embodiments of the invention. The voltage levels of the CMDS signals and the DQS signals shown in FIGS. 3-6 may be reversed according to various embodiments of the invention.

Figure 7:
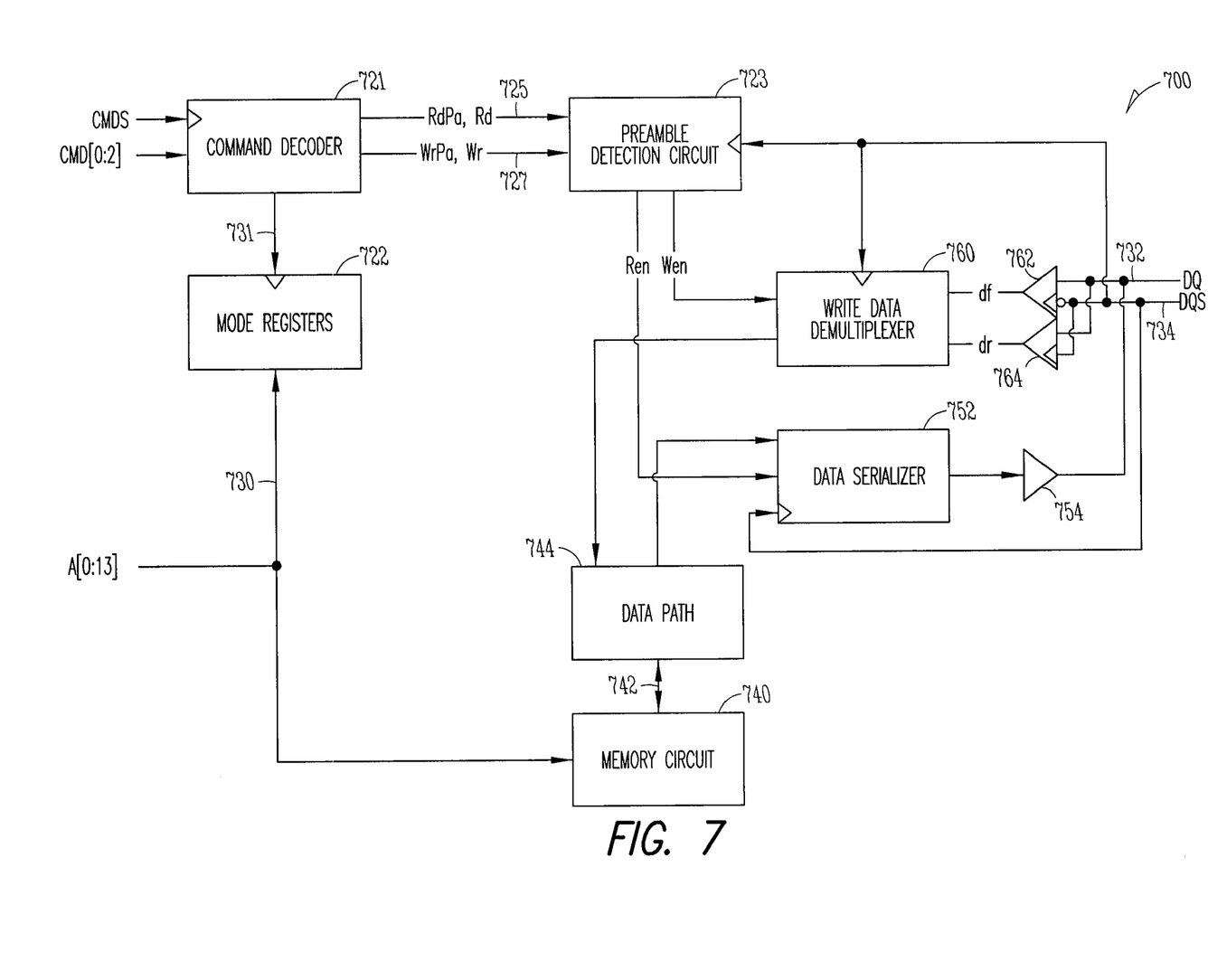
FIG. 7 is a block diagram of a memory device according to various embodiments of the invention.

FIG. 7 is a block diagram of a memory device 700 according to various embodiments of the invention. The memory device 700 is an embodiment of one of the IC dice 120, 124, 126 and 128 shown in FIG. 1.

The memory device 700 includes a command decoder 721 coupled to receive external command signals including three CMD signals on channels CMD [0:2] and a CMDS signal. The memory device 700 includes one or more mode registers 722 that can be programmed with information for operating the memory device 700. The CMD signals may be decoded by the command decoder 721 to generate the commands shown in FIG. 3-6 and described above, including the read command (Rd), the read with preamble command (RdPa), the write command (Wr), and the write with preamble command (WrPa) that are coupled to a preamble detection circuit 723 over channels 725 and 727. The preamble detection circuit 723 identifies preambles in DQS signals along with the commands received on the channels 725 and 727 and enables the memory device 700 to latch DQ signals following the preambles as described below.

The memory device 700 includes an address bus 730 coupled to receive address (A) signals on channels A[0:13]. The mode registers 722 have operating information that is programmed by the CMD signals decoded by the command decoder 721 and the A signals from the address bus 730 on initialization or boot-up of the memory device 700. The mode registers 722 can be advanced by the CMDS signal received on a channel 731.

The memory device 700 is coupled to transmit and receive DQ signals through a DQ bus 732. The DQ bus 732 is a bidirectional bus. The memory device 700 is also coupled to receive a DQS signal from a DQS channel 734. The DQS channel 734 may be part of a DQS bus coupled to other memory devices (not shown).

The memory device 700 includes a memory circuit 740 including an array of memory cells in which data may be stored. The cells in the memory circuit 740 may include DRAM devices or flash memory devices.

The memory circuit 740 is coupled to the address bus 730 to receive the A signals to identify locations in the memory circuit 740 that are linked to read or write commands. Read and write operations are executed in response to the CMD signals received by the command decoder 721.

DQ signals are transferred to and from the memory circuit 740 through a bidirectional link 742 and a data path circuit 744. The data path circuit 744 is coupled to transmit DQ signals to a data serializer 752 that serializes the DQ signals to be driven by a plurality of drivers 754 on to the DQ bus 732 during a read operation. The data serializer 752 is coupled to the DQS channel 734 to be advanced by the DQS signal.

The data path circuit 744 is coupled to receive DQ signals from a write data demultiplexer 760. The write data demultiplexer 760 receives a df signal from a first receiver 762 and a dr signal from a second receiver 764. The df signal represents data on a falling edge of a DQ signal on the DQ bus 732, and the dr signal represents data on a rising edge of the DQ signal.

Both the first receiver 762 and the second receiver 764 are coupled to the DQ bus 732 to receive the DQ signal. The DQ signal is a double-data rate (DDR) signal containing information on a rising DQS signal edge of the DQS signal and a falling DQS signal edge of the DQS signal. Both the first receiver 762 and the second receiver 764 are coupled to the DQS channel 734 to receive the DQS signal. The second receiver 764 is advanced by the DQS signal to drive the dr signal to the write data demultiplexer 760 representing data from the DQ signal on the rising DQS signal edge of the DQS signal. The first receiver 762 includes an inverter to invert the DQS signal, and is advanced by an inverted DQS signal to drive the df signal to the write data demultiplexer 760 representing data from the DQ signal on the falling DQS signal edge of the DQS signal.

The write data demultiplexer 760 is coupled to the DQS channel 734 to advance in response to the DQS signal to latch the df signal and the dr signal. The latched signals are then coupled to the data path circuit 744.

The preamble detection circuit 723 generates a read enable (Ren) signal that is coupled to the data serializer 752 to enable the data serializer 752 to serialize DQ signals received from the data path circuit 744. The preamble detection circuit 723 also generates a write enable (Wen) signal that is coupled to the write data demultiplexer 760 to enable the write data demultiplexer to latch the df signal and the dr signal. The preamble detection circuit 723 generates the Ren signal in response to the Rd command or the RdPa command. The RdPa command results in a delayed Ren signal to accommodate for the preamble. The preamble detection circuit 723 generates the Wen signal in response to the Wr command or the WrPa command. The WrPa command results in a delayed Wen signal to accommodate for the preamble. The DQ signal is therefore latched following a preamble in the DQS signal if the preamble is transmitted, as is shown in FIGS. 3-6.

In FIGS. 3-7, a WrPa command or a RdPa command indicates the transmission of a preamble with the DQS signal. Another type of command may be generated or decoded by the command decoder 721 to indicate the transmission of a preamble with the DQS signal according to various embodiments of the invention.

Figure 8:
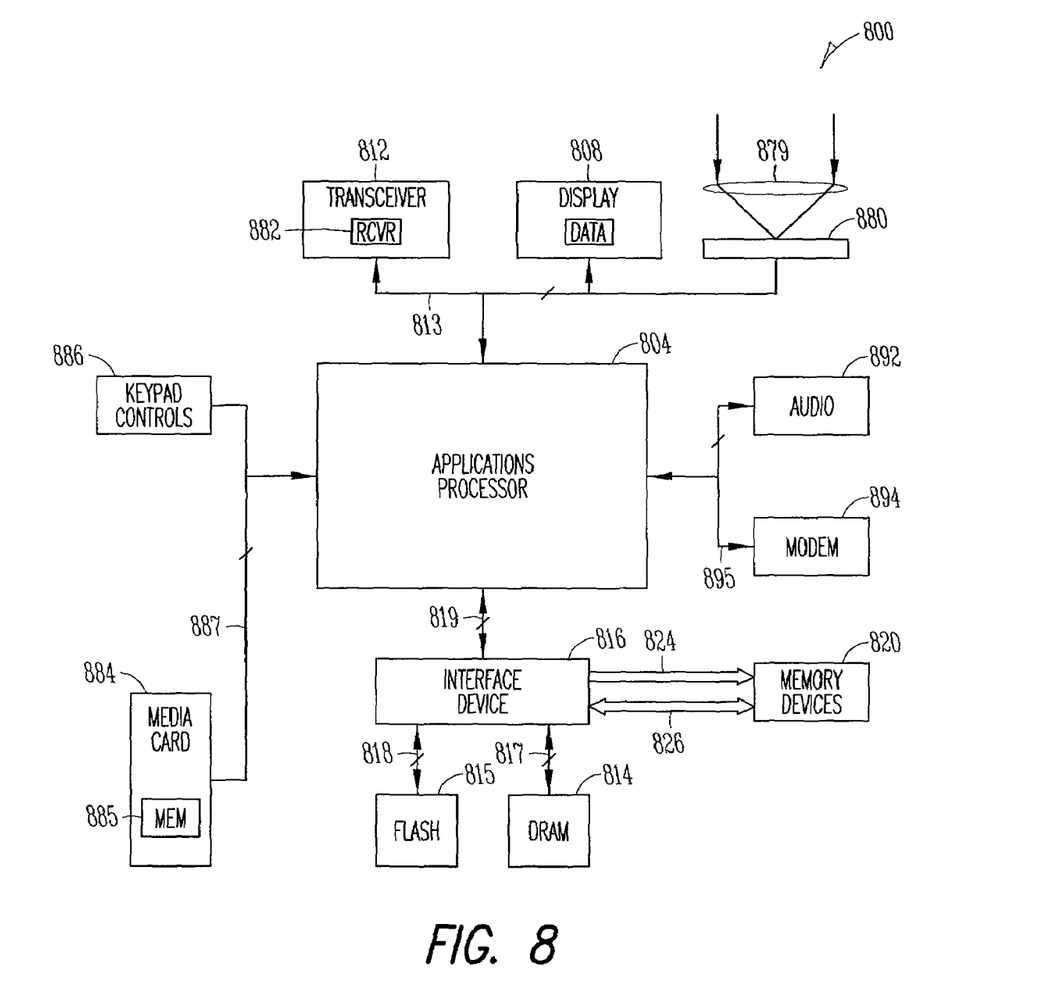
FIG. 8 is a block diagram of a system according to various embodiments of the invention.

FIG. 8 is a block diagram of a system 800 according to various embodiments of the invention. The system 800, in some embodiments, may include a processor 804 coupled to a display 808 and/or a wireless transceiver 812 through a bus 813. The display 808 may be used to display data, perhaps received by the wireless transceiver 812. The system 800 includes memory devices such as a DRAM DIMM 814 including a plurality of DRAM devices and/or a flash DIMM 815 including a plurality of flash memory devices. The flash DIMM 815 may comprise a solid state disk. The DRAM DIMM 814 is coupled to exchange information with an interface device 816 over a bus 817. The flash DIMM 815 is coupled to exchange information with the interface device 816 over a bus 818. The processor 804 is coupled to exchange information with the interface device 816 over a bus 819. The DRAM devices in the DRAM DIMM 814 may be synchronous DRAM (SDRAM) devices.

The system 800 includes a group of memory devices 820 with several separate IC dice (not shown). Each of the IC dice may comprise one or more DRAM devices, one or more flash memory devices, and combinations of these, according to various embodiments of the invention. The group of memory devices 820 is coupled to receive control and address signals from the interface device 816 over a number of channels 824. Each of the channels 824 may be an electrically conductive path. The group of memory devices 820 is coupled to exchange data signals with the interface device 816 over a number of channels grouped as a data bus 826. The group of memory devices 820, the interface device 816, the channels 824, and the data bus 826 can therefore be similar to or identical to corresponding elements of the system 100 shown in FIG. 1. Control, address and data signals are exchanged between the interface device 816 and the group of memory devices 820 according to the various embodiments of the invention described herein.

In some embodiments, the system 800 may include a camera that comprises a lens 879 and an imaging plane 880 to couple to the processor 804 through the bus 813. The imaging plane 880 may be used to receive light captured by the lens 879.

Many variations are possible. For example, in some embodiments, the system 800 may include a cellular telephone receiver 882 forming a portion of the wireless transceiver 812. The cellular telephone receiver 882 may operate to receive data to be processed by the processor 804 and displayed on the display 808. In some embodiments, the system 800 may include an audio, video, or multi-media player 884, including a memory device 885 and a set of media playback controls 886 to couple to the processor 804 through a bus 887. The processor 804 may also be coupled to exchange information with an audio device 892 and/or a modem 894 through a bus 895.

Systems including an interface device and one or more memory devices presented herein may provide increased efficiency by exchanging information using a strobe signal with or without a preamble. A first command indicates the existence of the preamble and a second command indicates its absence to enable each of the memory devices without a free-running clock to respond appropriately. This can lead to a significant performance improvement in a variety of electronic devices that incorporate such memory devices.

Any of the circuits or systems described herein may be referred to as a module. A module may comprise a circuit and/or firmware according to various embodiments.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the claims. In addition, in the foregoing Detailed Description, it can be seen that various features are arranged together for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of one or more of the disclosed embodiments. Thus, the following claims are hereby incorporated into the Detailed Description, with each claim standing on its own as a separate embodiment.

What is claimed is:

1. A method comprising:
   receiving a strobe signal in a device;
   determining if the strobe signal includes a preamble; and
   delaying execution of an operation in the device when the strobe signal includes a preamble.

2. The method of claim 1, wherein delaying execution of an operation includes:
   latching data signals beginning from a first edge of the strobe signal when the strobe signal does not include a preamble; and
   latching data signals beginning from an edge of the strobe signal that follows the first edge of the strobe signal when the strobe signal includes a preamble.

3. The method of claim 1, further comprising:
   receiving a command for the operation to indicate if the strobe signal includes a preamble.

4. The method of claim 3, wherein receiving the command further comprises:
   receiving a read command or receiving a write command in the device, the device comprising a memory device.

5. The method of claim 1, wherein delaying the execution of the operation comprises:
   delaying the execution of the operation with a preamble detection circuit in the device that is coupled to receive the strobe signal.

6. The method of claim 1, further comprising:
   operating the device without a free-running clock signal.

7. An apparatus comprising:
   a device coupled to receive a strobe signal; and
   a preamble detection circuit in the device to delay execution of an operation in the device when the strobe signal includes a preamble.

8. The apparatus of claim 7, wherein the device is coupled to receive a command to indicate when the strobe signal includes a preamble.

9. The apparatus of claim 7, wherein the preamble detection circuit is coupled to enable a latch circuit to latch data from a data signal on edges of the strobe signal.

10. The apparatus of claim 7, wherein the device is not structured to receive or to generate a free-running clock signal.

11. The apparatus of claim 7, wherein:
   the device comprises a memory device including an array of memory cells to store data;

the preamble detection circuit is coupled to enable a demultiplexor to latch data to execute a write operation; and the preamble detection circuit is coupled to enable a serializer to serialize data to execute a read operation.

12. A method in a system that determines whether to transmit a strobe signal with a preamble to a memory device, the method comprising:

receiving the strobe signal in the memory device;

determining whether the strobe signal was transmitted with the preamble; and delaying execution of an operation in the memory device when the strobe signal was transmitted with the preamble.

13. The method of claim 12, wherein the preamble is transmitted with the strobe signal depending on characteristics of a channel that is to carry the strobe signal.

14. The method of claim 12, further comprising:

receiving a command to indicate when the strobe signal is to be transmitted with a preamble.

15. The method of claim 14, wherein receiving a command further comprises:

receiving a read command or receiving a write command.

16. The method of claim 12, further comprising operating the memory device without a free-running clock.

17. A method comprising:

receiving a command to initiate an operation in a device and to indicate whether a strobe signal received by the device includes a preamble; and delaying execution of the operation in the device when the strobe signal includes a preamble.

18. The method of claim 17, wherein receiving the command further comprises:

receiving a first command to initiate the operation and to indicate that the strobe signal received by the device includes a preamble; and receiving a second command to initiate the operation and to indicate that the strobe signal received by the device does not include a preamble.

19. The method of claim 17, wherein receiving the command further comprises:

receiving a read command or a write command to initiate a read operation or a write operation, the device comprising a memory device.

20. The method of claim 17, further comprising operating the device without a free-running clock.

21. A system comprising:

an interface device; and a memory device coupled to receive command signals, address signals, and a strobe signal from the interface device, the memory device including:

a command decoder to decode the command signals; and a preamble detection circuit to delay a latch of data signals when the command signals indicate that the strobe signal includes a preamble.

22. The system of claim 21, wherein the interface device is structured to:

transmit the command signals, the address signals, and the strobe signal to the memory device; and determine whether to include a preamble in the strobe signal.

23. The system of claim 21, wherein the memory device is structured to operate without a free-running clock.

24. The system of claim 21, wherein:

the memory device comprises a dynamic random access memory (DRAM) device or a flash memory device that includes an array of memory cells to store data received from the interface device; and the command signals comprise write signals or read signals.

25. The system of claim 21, wherein:

the memory device comprises a plurality of memory devices; and the interface device, the memory devices and channels coupled between the interface device and the memory devices are included in a stack.

26. The system of claim 21, wherein the preamble comprises two strobe signal edges.

* * * * *

UNITED STATES PATENT AND TRADEMARK OFFICE
CERTIFICATE OF CORRECTION

| | | |
|---|---|---|
| PATENT NO. | : 8,169,841 B2 | Page 1 of 1 |
| APPLICATION NO. | : 12/358977 | |
| DATED | : May 1, 2012 | |
| INVENTOR(S) | : James Brian Johnson et al. | |

It is certified that error appears in the above-identified patent and that said Letters Patent is hereby corrected as shown below:

In column 9, line 2, in Claim 11, delete "demultiplexor" and insert -- demultiplexer --, therefor.

Signed and Sealed this
Third Day of July, 2012

David J. Kappos
*Director of the United States Patent and Trademark Office*